United States Patent
Wu et al.

(10) Patent No.: US 10,976,672 B2
(45) Date of Patent: Apr. 13, 2021

(54) SYSTEM AND METHOD FOR PERFORMING LITHOGRAPHY PROCESS IN SEMICONDUCTOR DEVICE FABRICATION

(71) Applicant: Taiwan Semiconductor Manufacturing Company, Ltd., Hsinchu (TW)

(72) Inventors: Jui-Ching Wu, Hsinchu (TW); Jeng-Horng Chen, Hsin-Chu (TW); Chia-Chen Chen, Hsinchu (TW); Shu-Hao Chang, Taipei (TW); Shang-Chieh Chien, New Taipei (TW); Ming-Chin Chien, Hsinchu (TW); Anthony Yen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/397,678

(22) Filed: Apr. 29, 2019

(65) Prior Publication Data

US 2019/0250522 A1  Aug. 15, 2019

Related U.S. Application Data

(62) Division of application No. 13/900,192, filed on May 22, 2013, now Pat. No. 10,274,838.
(Continued)

(51) Int. Cl.
  *G03F 7/20* (2006.01)
  *G03F 9/00* (2006.01)

(52) U.S. Cl.
  CPC ........ *G03F 7/70641* (2013.01); *G03F 7/7085* (2013.01); *G03F 7/70141* (2013.01);
  (Continued)

(58) Field of Classification Search
  CPC .... G03F 9/7003; G03F 9/7007; G03F 9/7019; G03F 9/7026; G03F 9/703; G03F 9/7034;
  (Continued)

(56) References Cited

U.S. PATENT DOCUMENTS

| | | |
|---|---|---|
| 5,748,323 A | 5/1998 | Levinson |
| 6,356,616 B1 | 3/2002 | Tetsuya et al. |

(Continued)

OTHER PUBLICATIONS

Rian Rubingh, Marco Moers, Manfred Suddendorf, Peter Vanoppen, Aernout Kistenan, Michael Thier, Vladan Blahnik and Eckhard Piper; "Lithographic Performance of a Dual Stage, 0.93NA ArF Step & Scan System;" 2005; pp. 681-692; Proc. Of SPIE vol. 5754.

(Continued)

*Primary Examiner* — Christina A Riddle
(74) *Attorney, Agent, or Firm* — Haynes and Boone, LLP (57) ABSTRACT

Systems and methods that include providing for measuring a first topographical height of a substrate at a first coordinate on the substrate and measuring a second topographical height of the substrate at a second coordinate on the substrate are provided. The measured first and second topographical heights may be provided as a wafer map. An exposure process is then performed on the substrate using the wafer map. The exposure process can include using a first focal point when exposing the first coordinate on the substrate and using a second focal plane when exposing the second coordinate on the substrate. The first focal point is determined using the first topographical height and the second focal point is determined using the second topographical height.

18 Claims, 9 Drawing Sheets

Related U.S. Application Data (60) Provisional application No. 61/782,903, filed on Mar. 14, 2013.

(52) U.S. Cl.
CPC ........ G03F 7/70991 (2013.01); G03F 9/7026 (2013.01); G03F 9/7057 (2013.01); G03F 9/7061 (2013.01)

(58) Field of Classification Search
CPC .... G03F 9/7053; G03F 9/7061; G03F 9/7057; G03F 7/70133; G03F 7/70141; G03F 7/70608; G03F 7/70641; G03F 7/70666; G03F 7/70716; G03F 7/70725; G03F 7/70775; G03F 7/7085; G03F 7/7991; G03F 7/70908; G03F 7/70925; G03F 7/70933; G03F 7/70991; G03F 7/70858; G03F 9/70253; B81B 2201/12; G01Q 60/24; G01Q 60/363; G01B 13/02–065; G01B 13/12; G01B 13/14; G01B 13/16; G01B 13/22; G01B 13/24
USPC .... 355/30, 52, 53, 55, 67–77; 250/310, 311, 250/492.1, 492.2, 492.21; 356/600, 625, 356/630, 634, 72; 73/37–37.6, 37.8
See application file for complete search history.

(56) References Cited

U.S. PATENT DOCUMENTS

| | | | |
|---|---|---|---|
| 6,406,820 B1 | 6/2002 | Ota et al. | |
| 6,633,050 B1 | 10/2003 | Lyons et al. | |
| 2002/0127865 A1 | 9/2002 | Maltabes et al. | |
| 2004/0257545 A1* | 12/2004 | Brinkhof | G03F 9/7026 355/53 |
| 2005/0128456 A1 | 6/2005 | Nelson et al. | |
| 2005/0179880 A1* | 8/2005 | Butler | G03F 9/7034 355/53 |
| 2006/0160037 A1 | 7/2006 | Brodsky et al. | |
| 2007/0181827 A1* | 8/2007 | Tempelaars | G03F 9/7034 250/492.1 |
| 2007/0252963 A1* | 11/2007 | Modderman | G03B 27/42 355/53 |
| 2007/0262268 A1* | 11/2007 | De Nivelle | G03F 9/7003 250/492.1 |
| 2008/0297743 A1 | 12/2008 | Arita et al. | |
| 2009/0190108 A1* | 7/2009 | Ema | G03B 27/42 355/52 |
| 2009/0325087 A1* | 12/2009 | Lyons | G03B 27/52 430/30 |
| 2010/0081096 A1* | 4/2010 | Itai | G03F 7/70508 430/325 |
| 2010/0309445 A1* | 12/2010 | Schultz | G01B 13/12 355/30 |
| 2013/0176558 A1* | 7/2013 | Lin | G03F 7/7065 356/237.5 |
| 2016/0370711 A1* | 12/2016 | Schmitt-Weaver | G03F 7/70725 |

OTHER PUBLICATIONS

Bernhard Liegl, Allen Gabor, Colin Brodsky; John Cotte and Mahadevaiyer Krishnan, "Measuring Layer-Specific Depth-Of-Focus Requirements;" 2008; pp. 1-10; Proc. Of SPIE vol. 6924 69244J.

* cited by examiner

SYSTEM AND METHOD FOR PERFORMING LITHOGRAPHY PROCESS IN SEMICONDUCTOR DEVICE FABRICATION

PRIORITY

This application is a divisional application of U.S. patent application Ser. No. 13/900,192, filed May 22, 2013, which claims priority to U.S. Provisional Patent Application Ser. No. 61/782,903, filed on Mar. 14, 2013, and entitled "System And Message For Performing Lithography Process In Semiconductor Device Fabrication," the entire disclosures of which are hereby incorporated herein by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process provides benefits by increasing production efficiency and lowering associated costs. However, it has also increased the complexity of processing and manufacturing ICs, and, for these advances to be realized, similar developments in IC manufacturing are needed.

Semiconductor devices are fabricated by creating a sequence of patterned layers defining semiconductor device features. Lithographic techniques are critical to providing these features and thus to semiconductor manufacturing generally. In a typical lithography process, a photosensitive layer (resist) is applied to a surface of a semiconductor substrate, and an image of features defining parts of the semiconductor device is provided on the layer by exposing the layer to a pattern of radiation. As semiconductor processes evolve to provide for smaller critical dimensions, and devices reduce in size and increase in complexity including number of layers, accurately patterning the features is increasingly more important to the quality, reliability, and yield of the devices. However, this patterning process is sensitive to the topographic heights of the target layer being exposed. Specifically, the depth of focus of the lithography system must account for these differences or the image may be substantially deteriorated. This problem may become more and more serious with use of higher numerical aperture (NA) processes. Furthermore, as the lithography systems to require strict environments for the target substrate (e.g., immersion fluid, vacuum, etc.), this also increases the challenges of understanding the topography of the target substrate.

Thus, while the typical fabrication processes may provide for some understanding of the level of topography of a substrate targeted for producing an image thereon, improvements in these metrology and lithography processes and systems may be desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
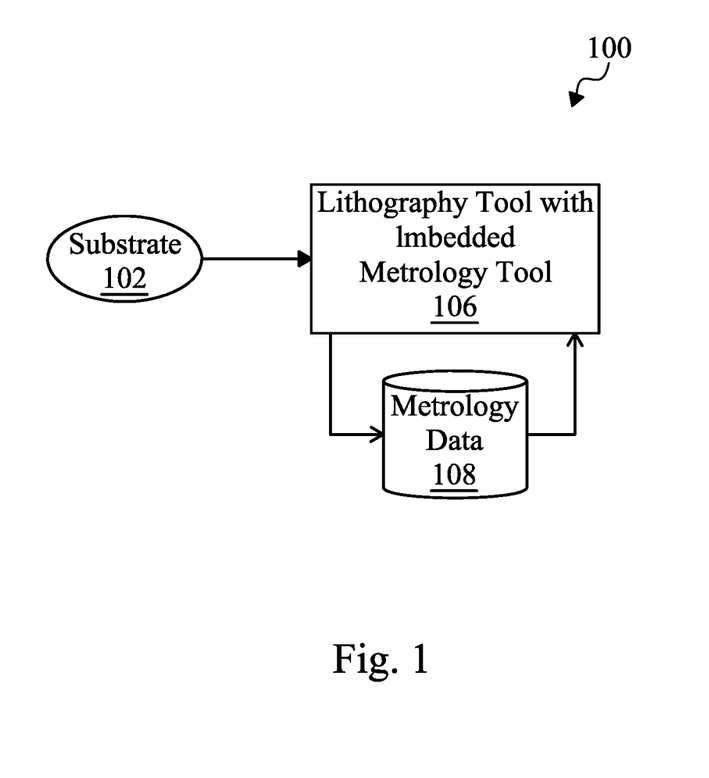
FIG. 1 is a diagrammatic representation of an embodiment of a system for measuring a topographical height of a surface of a target substrate during a lithography process.
Figure 2:
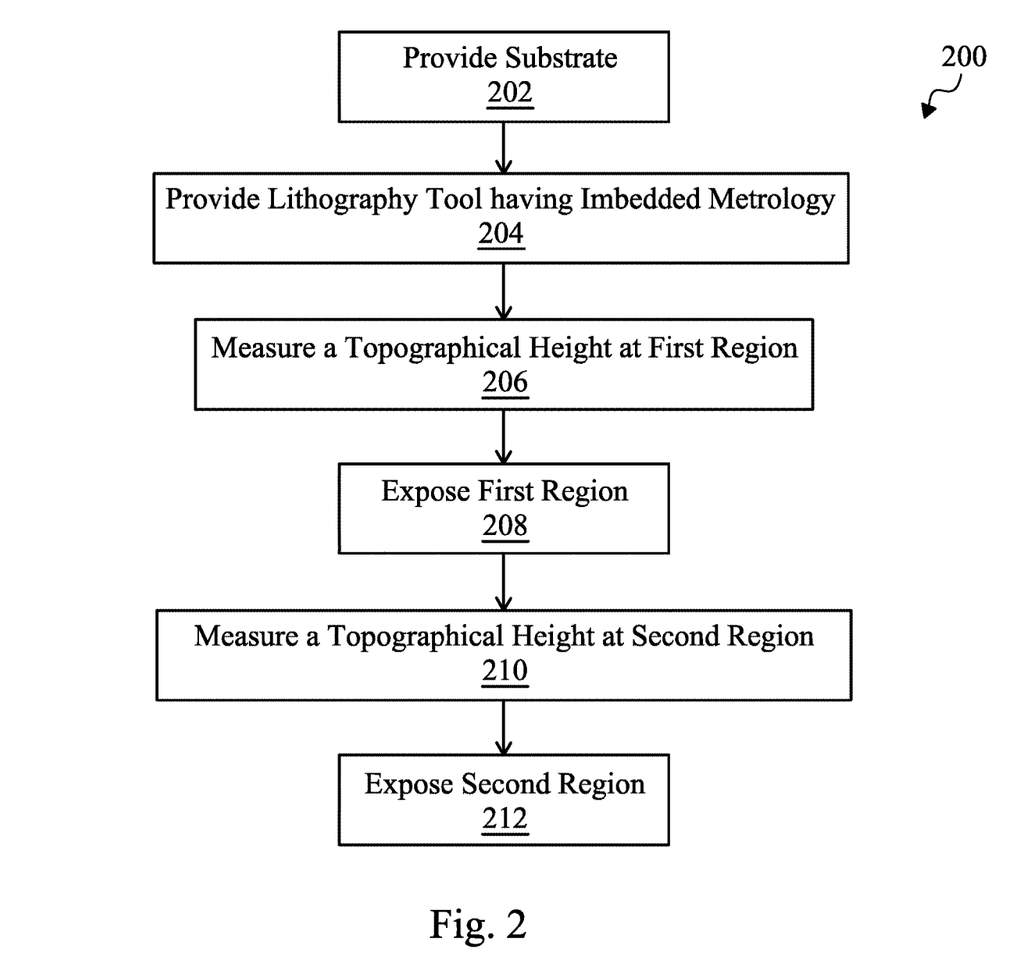
FIG. 2 is a flow chart illustrating an embodiment of a method of patterning a device according to one or more aspects of the present disclosure.
Figure 3:
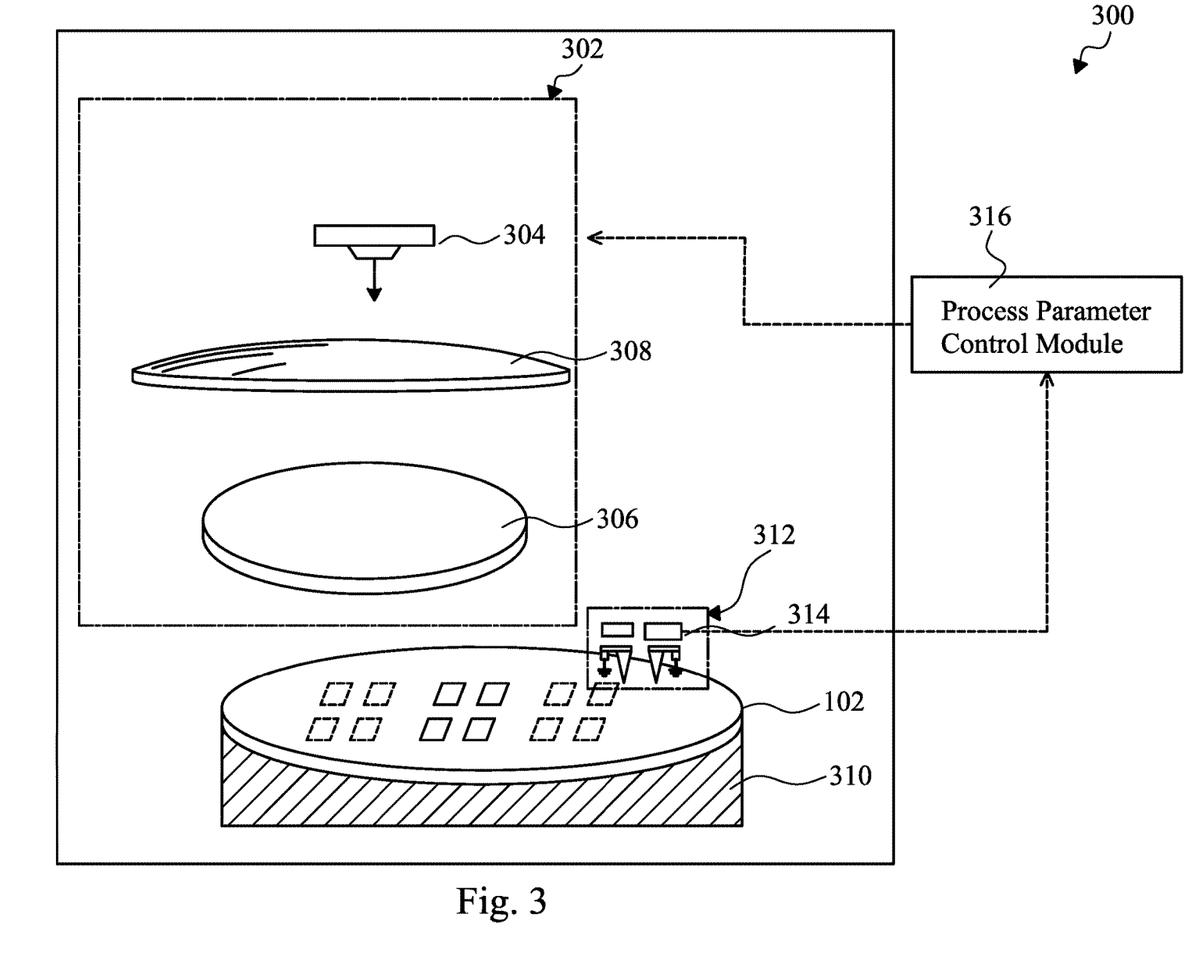
FIG. 3 is a simplified schematic view of an embodiment of a lithography tool according to one or more aspects of the present disclosure.

Illustrated in FIG. 1 is a system 100 for measuring a topographical height of a surface of a target substrate during a lithography process. FIG. 2 illustrates a method 200 for performing a lithography process including measuring a topographical height. FIG. 3 illustrates a tool 300 for performing a lithography process and measuring a topographical height. The system 100, method 200, and/or tool 300 may be used together or separately to produce a pattern onto a layer of a target substrate during semiconductor fabrication. As such, any description below with reference to one of FIGS. 1, 2, and 3 may also apply to the other of FIGS. 1, 2 and 3. The system 100, method 200, and/or tool 300 may be used to fabricate a semiconductor device including, for example, an intermediate device formed during processing of an integrated circuit, or portion thereof, that may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

The topographical height of a layer of a substrate includes identifying the plane of a surface of the layer on the substrate. Typically, the topographical height would be a top surface of a top layer disposed on a substrate. It is important to understand the topographical height of a layer, or portion thereof, which is targeted to produce an image thereon. If the depth of focus (DOF) of a lithography tool is not set to expose the target layer at the appropriate topographical height, the image may be deteriorated. The topographical height of a layer or region of a substrate may vary from point to point across the substrate depending upon process variations (e.g., in depositing a layer), underlying feature topography, design requirements, and/or other aspects of semiconductor device fabrication.

The system 100 includes a substrate 102. In an embodiment, the substrate is a semiconductor substrate such as a semiconductor wafer. While one wafer is illustrated for ease of understanding, any number of substrates may be used in the system 100. The substrate 102 may be a silicon substrate. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. One or more layers and/or patterned features may be disposed on the substrate including a target layer desired to be patterned.

The substrate 102 is provided to a tool 106. The tool 106 is operable to perform a metrology measurement and provide a pattern onto the substrate 102. The patterning of the substrate may be performed using various radiation such as, for example, ultraviolet (UV) source, deep UV (DUV) source, extreme UV (EUV) source, and X-ray source. In an embodiment, the radiation source is an EUV source having a wavelength of about 13.5 nanometers (nm) or less. The patterning may be performed using lithography techniques known in the art. In an embodiment, the tool 106 provides a metrology measurement by an imbedded atomic force microscopy such as the metrology tool 600, described below with reference to FIG. 6. The tool 106 may hold the target substrate in a controlled environment such as in a vacuum environment while the patterning and measuring are performed.

Thus, the tool 106 is operable to produce metrology data 108, for example, by a multi-tip AFM tool such as the metrology tool 600. This metrology data 108 is in turned used by the tool 106 to modify a parameter of the exposure process of the substrate 102. For example, the metrology data may be used to modify a depth of focus or other recipe parameter for the exposure of substrate 102. In an embodiment, metrology data is obtained from a first point on the substrate 102; the imaging of the first point is then performed based on parameters determined from the metrology data 108 obtained from that first point. This process may continue for any number of points on the substrate 102.

Figure 9:
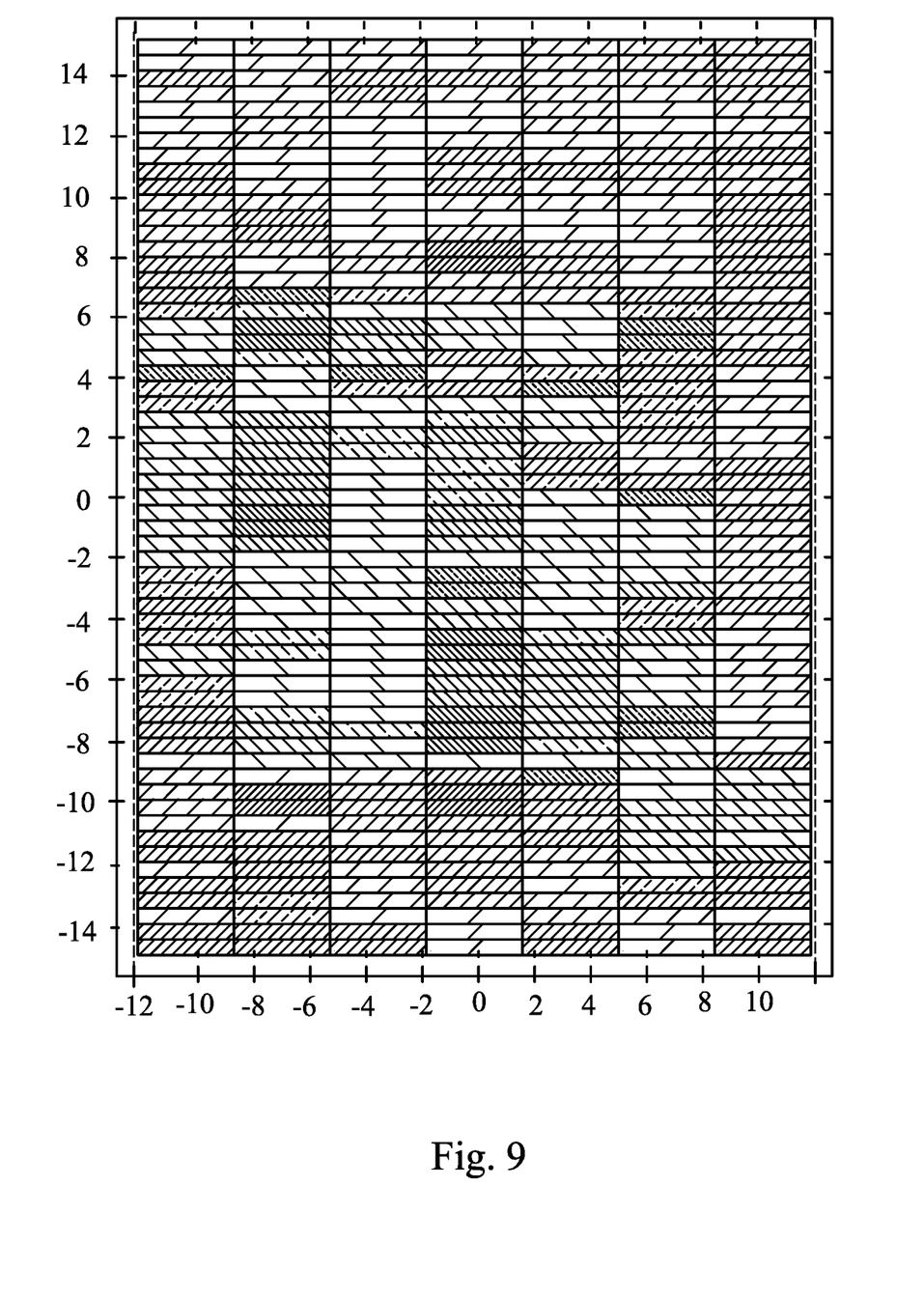
FIG. 9 is an exemplary embodiment of a wafer map.

In an embodiment, the metrology data 108 is provided in the form of a wafer map. An exemplary embodiment of a wafer map is illustrated in FIG. 9. A wafer map includes a representation of a wafer or portion thereof having a metrology data point indicated at plurality of coordinates on the representation of the wafer. In an embodiment, the metrology data point is associated with the height of a target layer to be imaged. In one embodiment, the actual height of the point as measured by the tool 106 is stored in as a wafer map.

In another embodiment, the metrology data points of the wafer map include offset values. An offset value may be a value determined from a comparison of (1) an actual measurement at a given point on the substrate 102 performed by the measurement tool such as the tool 106 (e.g., embedded AFM) with (2) an assumed height. The assumed height may be based on the design data, fabrication process data, simulation, process or product data (e.g., collected on other wafers). This offset value map may be used to modify a setting or value of a process parameter such as a focal plane during the exposure process. In an embodiment, the difference between the measured height at a given point and an expected height is stored as a wafer map. In yet another embodiment, a difference between the measured height at a given point and a mean or average height is stored as a wafer map.

As stated above, the tool 106 may be an exposure tool having an imbedded metrology tool. One exemplary embodiment of such a tool (having an imbedded metrology unit) is provided in FIG. 3. An imbedded metrology tool allows for measurement of a topographical height of the substrate 102 in-situ with the imaging of the substrate 102. The in-situ measurement allows for metrology data to be generated during an exposure process of a substrate. The measurement data may then be fed-forward to the scanner (e.g., in real time) to modify the exposure process. In an embodiment, this generated metrology data (e.g., height value or wafer map) is used to modify the exposure process by controlling the focal plane. The substrate need not be removed from a scanner during the collection of the metrology data. In an embodiment, the in-situ measurement and exposure processes are performed in a vacuum environment. In a further embodiment, the measurement is performed by multi-tip atomic force microscopy in the vacuum environment.

Describing this in-situ metrology measurement more detail and referring to FIG. 2, illustrated is the method 200 for performing an in-situ topographical height measurement during a patterning process of a target substrate. The method 200 may be performed using the system 100 and/or the tool 300, described below with reference to FIG. 3.

The method 200 begins at block 202 where a substrate is provided. The substrate may be a semiconductor substrate such as a semiconductor wafer. The substrate may be a silicon substrate. Alternatively, the substrate may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. One or more layers and/or patterned features may be disposed on the substrate including a target layer desired to be patterned. In an embodiment, the target layer is a resist. The substrate may be substantially similar to the substrate 102, discussed above.

The method 200 then proceeds to block 204 where a lithography tool is provided. The lithography tool as an embedded metrology tool. In an embodiment, the embedded metrology tool includes a multi-tip AFM tool. The lithography tool may be substantially similar to the tool 300, described below with reference to FIG. 3.

Specifically, the provided lithography tool has an imaging module and a metrology module. The imaging module and metrology module are imbedded in the same tool (e.g., housing). The imaging module and the metrology module are operable to act upon the same target substrate substantially concurrently and without requiring displacement of the substrate. In other words, the substrate is provided in a single chamber accessible to the imaging module and the metrology module. The imaging module may be a scanner; the metrology module (e.g., topographical height measurement device) may be a multi-tipped AFM tool such as described below with reference to FIG. 6. In an embodiment, the imaging module of the lithography tool operates using a vacuum environment. The metrology module may include measurement devices (e.g., AFM) that also operate in this vacuum environment (e.g., within the same chamber).

The method 200 then proceeds to block 206 where a topographical height of a target layer on the selected substrate is measured at first region or coordinate(s) of the substrate. The topographical height measurement measures a relative or absolute height of a target layer at the given region on the substrate. This measured height may provide the desired focal plane for an exposure process. The first region of the topographical height measurement may include a plurality of coordinates on the wafer. For example, in an embodiment, the topographical height measurement device includes a plurality of tips (e.g., a multi-tip AFM tool such as described below with reference to FIG. 6). Each tip may provide a height measurement at coordinate in the region.

The method 200 then proceeds to block 208 where the lithography process is performed on the substrate at the first region. The lithography process may be an exposure process. The exposure process is performed at the first region of the substrate; in other words, the region of the substrate in which the topographical height measurement was taken in block 206. The exposure process is performed using the topographical height information for the associated region on the substrate. The topographical height information may be used to determine and/or modify one or more parameters of the lithography process for a given coordinate of the substrate. In an embodiment, the modified parameter includes the DOF.

The method 200 then proceeds to block 210 where the topographical height of the target layer on the selected substrate is measured at a second region or coordinate of the substrate. The second region where the topographical height measurement is taken may include a plurality of coordinates on the wafer. For example, in an embodiment, the topographical height measurement device includes a plurality of tips (e.g., a multi-tip AFM tool such as described below with reference to FIG. 6). Each tip may provide a height measurement at a coordinate. The second region may be differently located than the first region, discussed above with reference to block 206. FIG. 7 is illustrative of plurality of regions and coordinates of a wafer where a topographical height measurement may be performed.

Block 210 may occur after block 206; block 210 may occur substantially concurrently with block 208. For example, the topographical height information and/or wafer map for a first region (e.g., coordinate) of a substrate may be generated and then that first region of the substrate imaged using the data for the first region. While the first region is imaged, topographical height information and/or a wafer map may be generated for a second region (e.g., coordinate) of a substrate. This information is subsequently used to image the second region of the substrate and so forth until the substrate patterning is complete.

The method 200 then proceeds to block 212 where a lithography process is performed on the substrate at the second region. The lithography process may be an exposure process performed at the second region of the substrate; in other words, the region of the substrate in which the topographical height measurement was taken in block 210. The exposure process is performed using the topographical height information for the associated region on the substrate. The topographical height information may be used to determine and/or modify one or more parameters of the lithography process for a given coordinate of the substrate. In an embodiment, the modified parameter includes the DOF. Block 212 may be performed simultaneously with the measurement of the topographical height of a third region of the substrate.

Blocks 206, 208, 210, and/or 212 may be repeated any number of times. Specifically, the topographical height may be measured at any number of coordinates on the selected wafer. Referring to the example of FIG. 7, illustrated is a wafer 102 and a multi-tip AFM tool 600. The tool 600 may pass across the wafer 102 in a path 702 providing measurements at various coordinates across the wafer 102.

Referring now to FIG. 3, illustrated is a lithography system 300 including an exposure module 302 designed to perform a lithography exposure process to a radiation-sensitive material layer (e.g., photosensitive layer or resist) on a substrate. The exposure module 302 includes a radiation source 304, a removable photomask 306, a plurality of projection optics 308 and a substrate 102, such as a semiconductor wafer, on a substrate stage 310. However, other configurations and inclusion or omission of elements may be possible.

The radiation source 304 may include a radiation source selected from the group consisting of a ultraviolet (UV) source, a deep UV (DUV) source, an extreme UV (EUV) source, and an X-ray source. In an example, the radiation source 304 is an EUV source having a wavelength of about 13.5 nm or less. Alternatively, the radiation source 304 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride (F2) excimer laser with a wavelength of 157 nm; or other light sources having a desired wavelength (e.g., below approximately 100 nm).

The photomask 306 can include transparent regions and/or reflective regions. A photomask may include a transparent substrate and a patterned absorption (opaque) layer. A radiation beam may be partially or completely blocked when incident on an opaque region. The opaque layer may be patterned to have one or more transparent regions or openings through which a radiation beam may travel through, thereby patterning the beam. Various other photomask technologies exist and are within the scope of the present disclosure. The mask 306 may incorporate other resolution enhancement techniques such as phase shift mask (PSM) and/or optical proximity correction (OPC).

The projection optics 308 may have refractive optics or reflective optics. The projection optics 308 direct the patterned radiation towards the substrate 102 (e.g., a semiconductor wafer). The system may also include refractive optics, such as a single lens or a lens system having multiple lenses, and reflective optics such as mirrors. For example, the illumination system includes micro-lens arrays, shadow masks, and/or other structures designed to aid in directing light from the radiation source 302 towards the photomask 306 and/or the substrate 102.

The substrate 102 includes a photosensitive layer (resist), which is sensitive to the radiation. The substrate 102 may be held by a target substrate stage 310. The target substrate stage 310 provides control of the target substrate position such that the image of the reticle is scanned onto the target substrate in a repetitive fashion (though other lithography methods are possible). The target substrate stage 310 provides control of the target substrate position such that topography height measurement may be obtained on the target substrate in a repetitive fashion (though other lithography methods are possible).

The exposure module 302 may include a controlled environment, e.g., a vacuum environment that includes the target substrate 102 and/or other components of the exposure module 302. In this controlled environment, a topography measurement module 312, or portions thereof, are also disposed.

The topography measurement module 312 includes a multi-tip atomic force microscopy (AFM) tool 314. The multi-tip AFM tool 314 may be included in the controlled (e.g., vacuum) environment. The multi-tip AFM tool 314 may be substantially similar to as discussed above with reference to FIGS. 1 and 2, and/or may be substantially similar to the AFM tool 600, described in detail below with reference to FIG. 6. The multi-tip AFM tool 314 may determine a relative and/or absolute height of a target layer on the substrate 102. This measurement is then provided to the parameter control module 316. The parameter control module 316 analyzes this height and determines a parameter for the exposure module 302.

The parameter control module may be substantially similar to the information handling and analysis system described below with reference to FIG. 8. The parameter control module 316 includes a processor, memory, and interface for storing and executing software and performing one or more tuning processes. In one embodiment, the parameter control module 316 may utilize the topographical height data from the topography measurement module 312 to perform a modification and/or determination of a parameter (e.g., recipe) for the exposure module 302. In an embodiment, the parameter determined for the exposure module 302 is a focal plane such as determining a depth of focus.

The lithography system 300 may further include other components and/or the components represented in FIG. 3 may be altered in their quantity, location, or configuration. Exemplary additional components include alignment modules and/or other devices typical of lithography tools such as scanners.

Thus, the system 100, method 200 and/or the tool 300 are operable to provide for determining topographical height information for a target layer formed on a substrate in-situ with performing a lithography process such as, an exposure process on the target layer. This topographical height information is fed-forward in real time to adjust a parameter of the lithography process such as a focal plane (or DOF).

Figure 4:
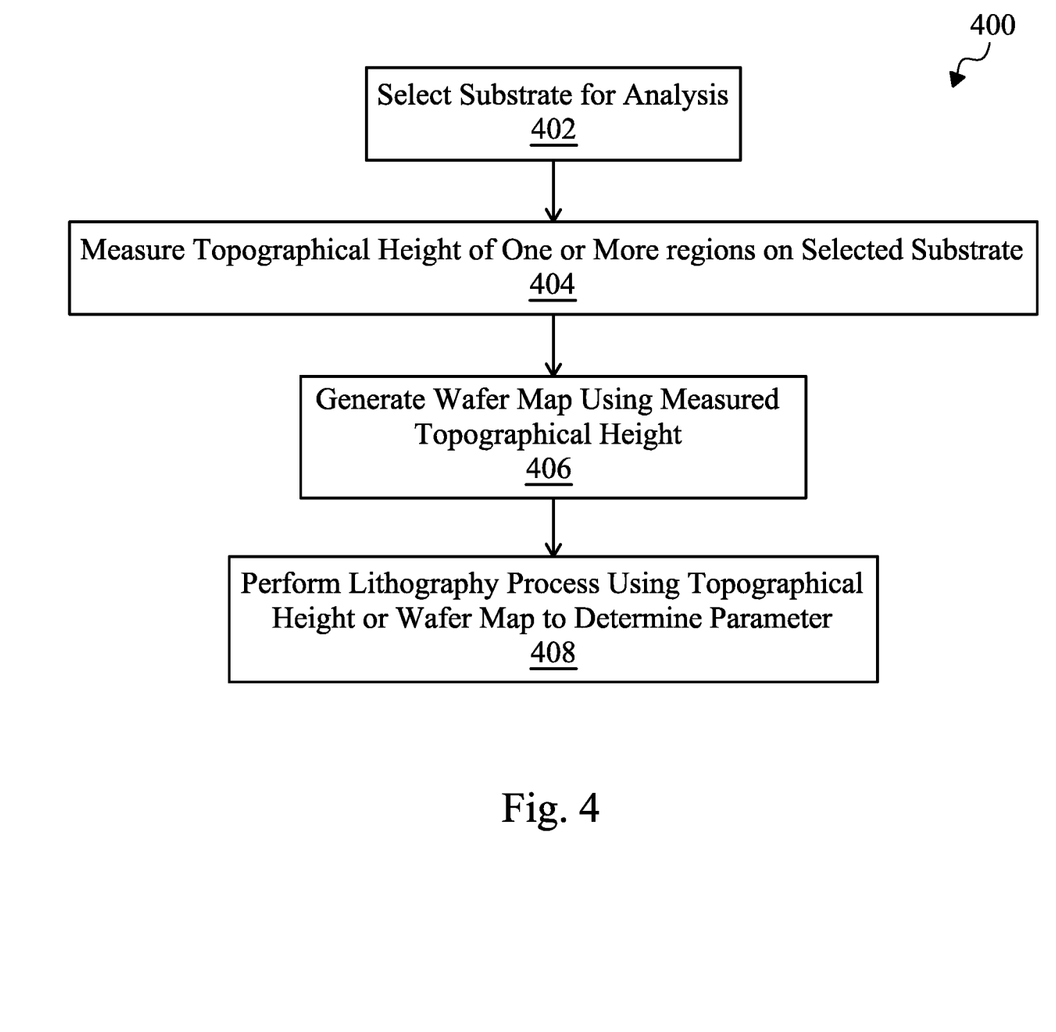
FIG. 4 is a diagrammatic representation of an embodiment of a system employing a feed forward control of a lithography process and system according to one or more aspects of the present disclosure.

Referring now to FIG. 4, illustrated is another embodiment of a method of performing a lithography process including obtaining and using topographical height information according to one or more aspects of the present disclosure. The method 400 of FIG. 4 begins at block 402 where a substrate is selected for analysis. The substrate may be a semiconductor substrate such as a semiconductor wafer. The substrate may be representative of a lot of wafers, product type and/or other demarcation of wafers provided in a typical fabrication line. The substrate may be a silicon substrate. Alternatively, the substrate may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. One or more layers and/or patterned features may be disposed on the substrate including a target layer desired to be patterned. In an embodiment, the target layer to be patterned is a photosensitive (resist) layer.

The method 400 then proceeds to block 404 where a topographical height of target layer on the selected substrate is measured. The topographical height measurement provides a relative or absolute height of a target layer at the given coordinate on the substrate. This height may be determining the plane of an upper surface of the target layer (e.g., resist).

In an embodiment, the topographical height is measured using a multi-tip AFM tool, such as the tool illustrated below with reference to FIG. 6. In an embodiment, the topographical height is measured using a measurement device based on detection of the pressure of air discharged onto the wafer surface. An embodiment of such a device is described in *Lithographic Performance of a Dual Stage, 0.93NA ArF Step & Scan System*, Proc. of SPIE Vol. 5754, p. 681 (2005), which is hereby incorporated by reference its entirety. Other exemplary measurement devices include those operating on principle such as, apparent surface depression, optical leveling principles, and/or other suitable topography measurement devices.

The topographical height may be measured at any number of coordinates on the selected wafer. Referring to the example of FIG. 7, illustrated is the wafer 102 and the multi-tip AFM tool 600. The tool 600 may pass across the wafer 102 in the path 702 providing measurements at various coordinates across the wafer 102.

The method 400 then proceeds to block 406 where a wafer map is generated. The topographical height value(s) obtained in block 404 are used to form a wafer map. The wafer map may include a graphical or data representation of a wafer having a metrology data point indicated at plurality of coordinates on the representation of the wafer. The data may be represented on a wafer representation using values, colors, gray-scale values, and/or other demarcations. Block 406 may be performed by a system such as the information handling and analysis system 800 described below with reference to FIG. 8. Further description is also provided with respect to the system 500 of FIG. 5.

In an embodiment, the wafer map includes an offset value at each of a plurality of coordinates on a substrate. An offset value may be a value determined from a comparison of (1) an actual measurement at a given point on the substrate 102 performed by the measurement tool such as the off-line measurement tool with (2) an optically detected height measurement at the same point on the wafer. In an embodiment, this optically detected height measurement may be performed by the lithography tool (e.g., in a vacuum environment). This optically detected height measurement may be less accurate than the off-line measurement tool and/or have been measured at a sub-set of points on the wafer. For example, in a further embodiment, an actual measurement is performed in block 404 at a plurality of coordinates on the wafer and an in-line measurement during an exposure process (e.g., block 408) may be performed at a subset of points. This offset value map may be used to modify a setting or value of a process parameter such as a focal plane during the exposure process. FIG. 9 is illustrative of an embodiment of a wafer map. (Note that in other embodiments configurations including circular maps representing a wafer shape are possible.)

Alternatively, an offset value may be a value determined from a comparison of (1) an actual measurement at a given point on the substrate performed by a measurement tool with (2) a predicted or expected topographical height at the point. The predicted or expected topographical height may be determined from design data, process data, simulations, and/or other suitable methods. The data such as process data may be data gathered from analysis of other substrates. In yet another embodiment, a difference between the measured height at a given point and a mean or average height is stored as a wafer map.

In an embodiment, the offset wafer map may include an offset correction for each of a plurality of points on the representation of the wafer. The offset correction may be associated with a modification of a parameter to be used in the lithography process (e.g., a modification to the DOF).

In another embodiment, the wafer map includes an actual topographical height measurement at each of a plurality of coordinates on the wafer. In still another embodiment of the method 400, block 406 is omitted and the topographical height is delivered directed to the lithography process without storage in a "map" representation.

The method 400 then proceeds to block 408 where a lithography process is performed using the topographical height information. In an embodiment, the lithography process is an exposure process such as performed by a scanner. The lithography process is performed using the measured topography height and/or the wafer map. The topographical height information and/or the offset correction map are used to determine and/or modify one or more parameters of the lithography process for a given coordinate of the substrate. In an embodiment, the modified parameter is directed to the focal plane of the exposure tool (e.g., DOF). The lithography process having the parameter determined by the topographical height and/or wafer map may be performed on the substrate selected in block 402, and/or other substrates. Specifically, the measurement corresponding to a coordinate on the substrate is used to determine the lithography process parameters used to image that coordinate. This may be performed for any number of coordinates on the substrate.

Figure 5:
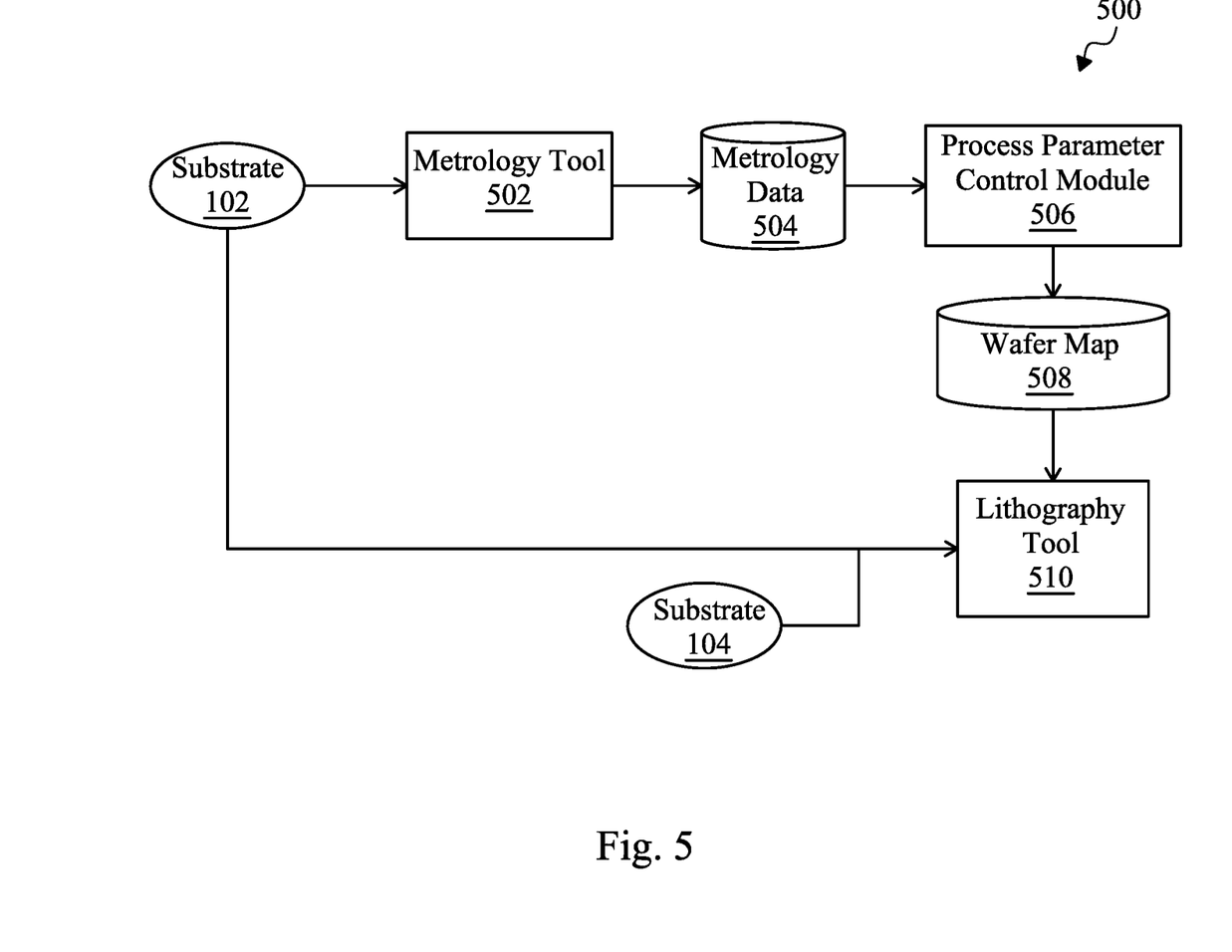
FIG. 5 is a flow chart illustrating an embodiment of a method of performing a lithography process according to one or more aspects of the present disclosure.

Referring now to FIG. 5, illustrated is a system 500 for performing a lithography process on a substrate. The system 500 may be used to implement the method 400, described above with reference to FIG. 4.

In the system 500, a substrate 102 is provided to a metrology tool 502. The substrate 102 may be substantially similar to the substrate discussed above with reference to the FIGS. 1, 2, 3, and/or 4. In an embodiment, the substrate is a semiconductor wafer. The metrology tool 502 is operable to determine a topographical height of a target layer on the substrate 102 at one or more points on the substrate. The topographical height measurement may determine a height of a surface of a resist layer at the given coordinate on the substrate 102.

In an embodiment, the metrology tool 502 includes a multi-tip AFM tool as described below with reference to FIG. 6. In an embodiment, the metrology tool 502 includes a device that measures a height based on detection of the pressure of air discharged onto the target surface. An embodiment of such a device is described in *Lithographic Performance of a Dual Stage, 0.93NA ArF Step & Scan System*, Proc. of SPIE Vol. 5754, p. 681 (2005), which is incorporated by reference in its entirety above. Other exemplary measurement devices include those operating on principles such as, apparent surface depression, optical leveling principles, and/or other suitable topography measurement devices.

The metrology tool 502 generates metrology data 504. The metrology data 504 may include a measurement of the height of a target layer on the substrate 102 at one or more locations. The metrology data 504 may be communicated to the process parameter control module 506. The process parameter control module 506 may be an information handling and analysis system substantially similar to as discussed below with reference to FIG. 8. The process parameter control module 506 may generate a wafer map 508. The topographical height value(s) obtained in block 404 are used to form the wafer map 508.

Specifically, the wafer map 508 may include a graphical or data representation of a wafer having a metrology data point indicated at plurality of coordinates on the representation of the wafer. In an embodiment, the wafer map 508 includes an offset value at each of a plurality of coordinates on a substrate. An offset value may be a value determined from a comparison of (1) an actual measurement at a given point on the substrate defined by the metrology data 504 with (2) a predicted or expected topographical height at the point or an optical measurement at the same location. The predicted or expected topographical height may be determined from design data, process data, simulations, and/or other suitable methods.

In another embodiment, an offset value of a wafer map may be a value determined from a comparison of (1) an actual measurement at a given point on the substrate 102 performed by the metrology tool 502 with (2) an optically detected height measurement by the lithography tool 510 at the same point on the wafer. In an embodiment, this optically detected height measurement may be performed by the lithography tool (e.g., in a vacuum environment). This optically detected height measurement may be less accurate than the off-line measurement tool and/or have been measured at a sub-set of points on the wafer.

In a further embodiment, the wafer map 508 may include an offset correction for each of a plurality of points on the representation of the wafer. The offset correction may define a modification of a parameter to be used in the lithography process (e.g., a value for the DOF). In another embodiment, the wafer map 508 includes an actual topographical height measurement at each of a plurality of coordinates on the wafer, which is used by the lithography tool 114 to generate a process parameter. The process parameter control module 506 may be part of the lithography tool 114 and/or the metrology tool 502.

The wafer map 508 is provided to the lithography tool 510. In some embodiments, the process parameter control module 506 may be included in the lithography tool 510. The lithography tool 510 uses the wafer map 508 to determine at least one parameter for the lithography process to be performed. In an embodiment, the wafer map 508 is used determine the focal plane for an exposure process performed by the lithography tool 510 (e.g., for the substrate 102).

The lithography tool 510 may be a scanner operable to pattern a photosensitive layer on the substrate 102. The patterning of the substrate may be performed using various radiation such as, for example, ultraviolet (UV) source, deep UV (DUV) source, extreme UV (EUV) source, and X-ray source. In an embodiment, the radiation source is an EUV source having a wavelength of about 13.5 nm or less. The patterning may be performed using lithography techniques known in the art. In an embodiment, the lithography tool 510 includes functionality and/or devices substantially similar to the exposure module 302 of FIG. 3.

Additional substrates, such as substrate 104, may also be provided to the lithography tool 510. The additional substrate 104 may be substantially similar to the substrate 102 except that an actual topography measurement may not have been performed on the substrate. The substrate 104 may include semiconductor devices of the same product type, be of the same processing lot, be partially fabricated and at the same processing step (e.g., layer), and/or have other corollary factors that lend to applying topography data of substrate 102 to the substrate 104.

Thus, the method 400 and/or the system 500 are operable to provide for determining topographical height information regarding a target layer formed on a substrate. The determined topographical height information (e.g., gathered off-line) is fed-forward to a lithography system. In an embodiment, topographical height information is generated by an AFM or air gauged based equipment. In an embodiment, a wafer map is generated from the measured topographical height information and provided to the lithography tool.

Figure 6:
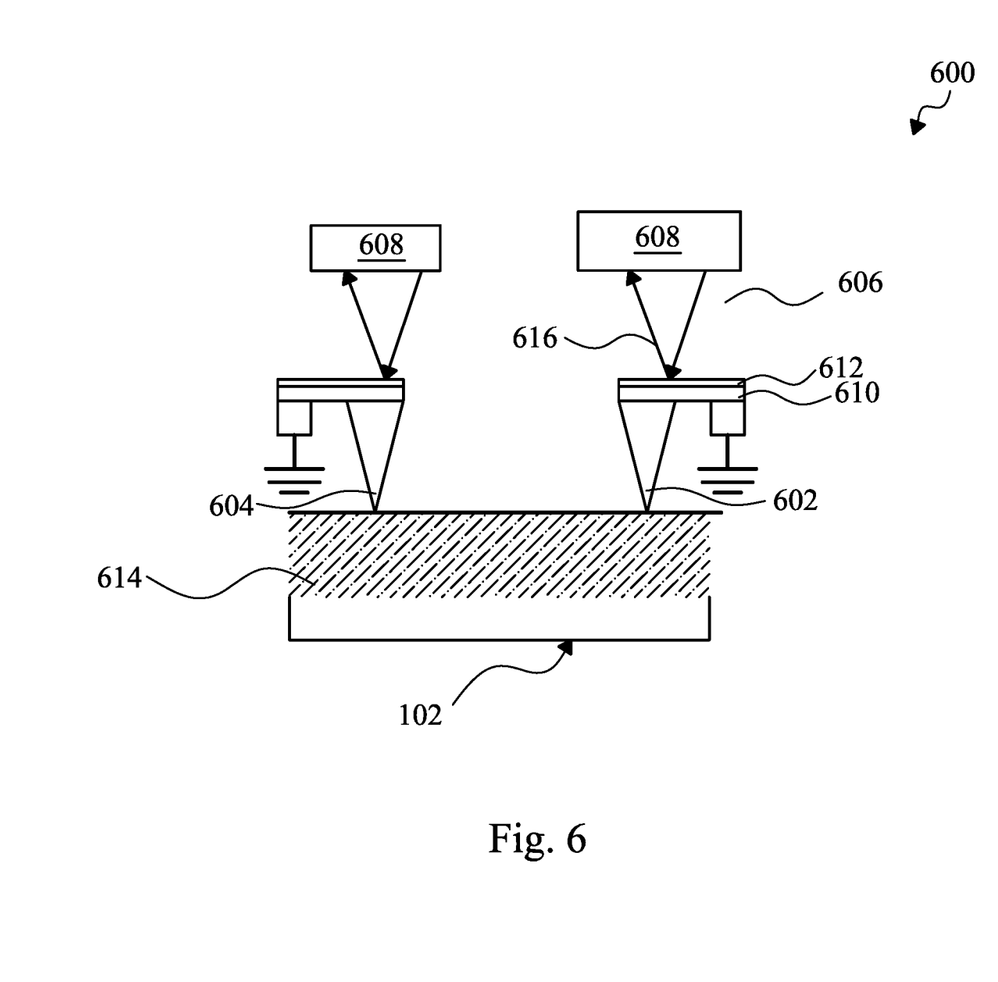
FIG. 6 is a side view of an embodiment of a system for measuring a topographical height of a target substrate.
Figure 7:
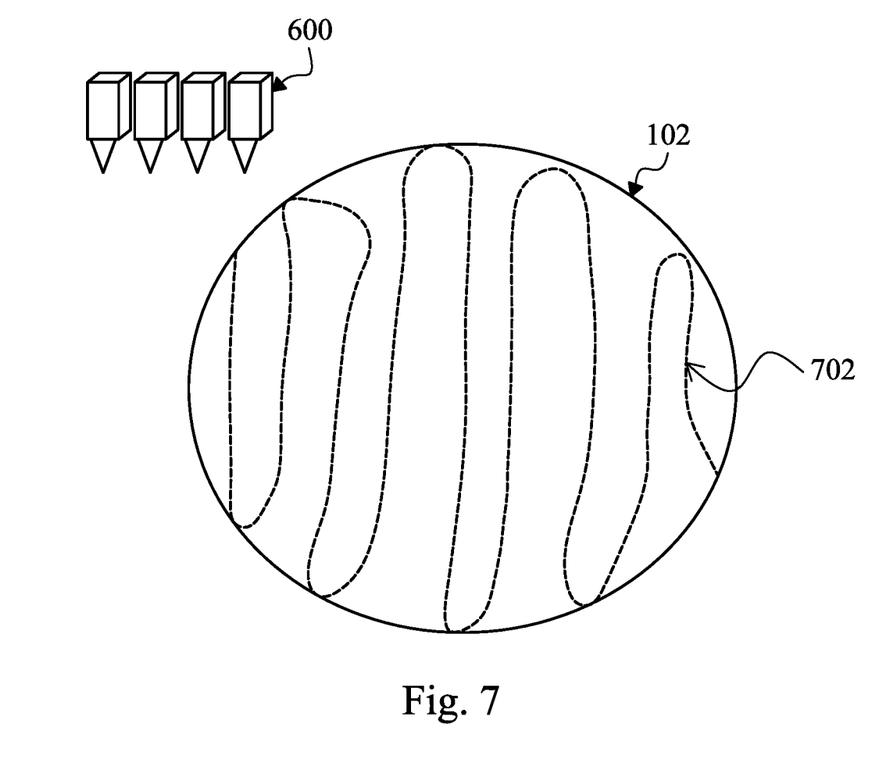
FIG. 7 is a diagrammatic representation of a substrate and a multi-tip topography measurement apparatus according to one or more aspects of the present disclosure.

Referring now to FIG. 6, illustrated is an exemplary embodiment of a multi-tip atomic force microscopy tool 600. The tips may also be referred to as probes. The AFM tool 600 as illustrated includes a first tip 602 and a second tip 604, described in further detail below. However, any number of tips may be included.

The AFM tool 600 provides an emitted light 606. The emitted light 606 may be generated by a level sensor 608. In an embodiment, a laser device of the level sensor 608 provides the emitted light 606. The emitted light is incident an arm (e.g., cantilever) 610, of the AFM tool 600. The arm 610 has a reflective surface 612. This emitted light 606 reflects from the surface 612, thereby providing reflected light 614. The reflected light 614 is returned to the level sensor 608. When the tip 602 or 604 contacts (or otherwise senses) a surface of a substrate 102 (such as a surface of a target layer 614), a force is applied to the arm 610. The force displaces the arm 610, thus, altering the deflection angle of the reflected light 616. A sensor in the level sensor 608 such as a plurality of photodiodes detects the reflected light 616. As the detected reflected light 616 indicates the deflection of the arm 610, and thus, the position of the tip 602/604 a height of the layer 614 (e.g., resist) can be determined.

Other embodiments and principles may be employed in the AFM tool 600 to sensor a topographical height of the layer 614 including for example, passing electrical currents through the tips, non-contact AFM, tapping mode AFM, and/or other suitable techniques.

Figure 8:
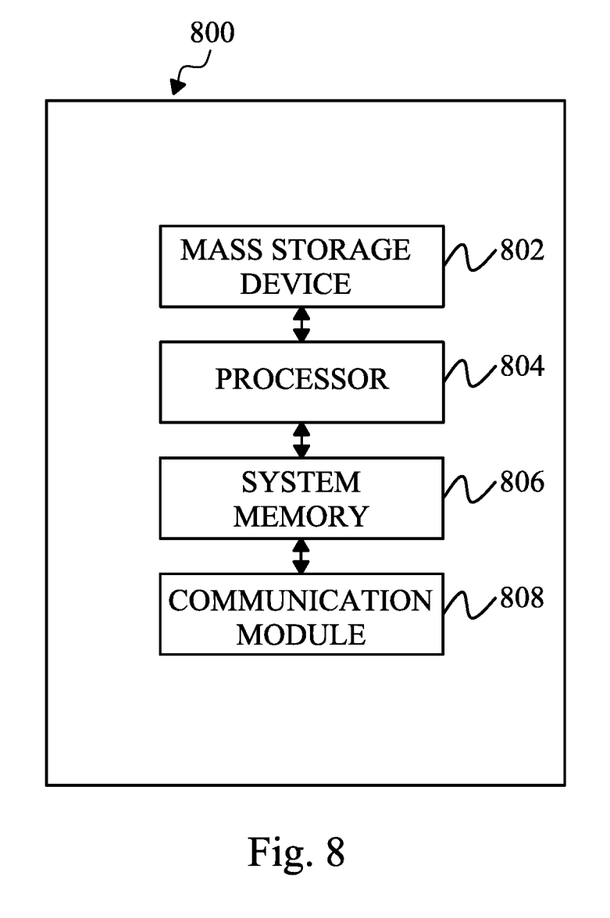
FIG. 8 is a block diagram an information handling and analysis system operable to perform one or more aspects of the present disclosure.

Referring now to FIG. 8, illustrated is an information handling and analysis system 800. The system 800 may be operable to perform one or more steps of the methods and/or functions of the systems described herein. The system 800 is an information handling system such as a computer, server, workstation, or other suitable device. The system 800 includes a processor 804 that is communicatively coupled to a system memory 806, a mass storage device 802, and a communication module 808. The system memory 806 provides the processor 804 with non-transitory, computer-readable storage to facilitate execution of computer instructions by the processor. Examples of system memory 806 may include random access memory (RAM) devices such as dynamic RAM (DRAM), synchronous DRAM (SDRAM), solid state memory devices, and/or a variety of other memory devices known in the art. The system memory 806 may store wafer maps, topographical height measurements, coordinates of substrates, and/or other information described above. Computer programs, instructions, and data are stored on the mass storage device 802. The programs may generate wafer maps, determine an offset value, and/or other steps described above. Examples of mass storage devices 802 may include hard discs, optical disks, magneto-optical discs, solid-state storage devices, and/or a variety other mass storage devices known in the art. The communication module 808 is operable to communicate information such as wafer maps, lithography parameters, metrology values, wafer identification data and/or other suitable information with the other components in the IC manufacturing system. The communication module 808 is also operable to receive user input into the system 800.

In summary, the methods and devices disclosed herein provide for lithography methods that allow for compensation in parameters used during the lithography process based on a measured topographical height of the layer to be imaged. In an embodiment, a lithography tool includes an embedded metrology device in order to provide a real-time measurement of substrate height. The embedded metrology device may be a multi-tip AFM tool. In another embodiment, a topographical height measurement is performed off-line and prior to a lithography process. The topographical height information may then be fed-forward to the lithography tool in order to select a suitable lithography parameter such as DOF. In doing so, the present disclosure offers several advantages over prior art devices. For example, an embedded multi-tip AFM tool allows for measurements to be taken during the exposure process in a vacuum environment. Furthermore, in some embodiments, performing an in-situ topographical height measurement may be performed efficiency as a measurement can be accomplished concurrently with an exposure. In other embodiments performing an off-line measurement of the topographical height measurement additional detailed information (e.g., measurement at additional coordinates on a wafer) may be performed as the process is accomplished separately from a scanner tool, which may be subject to throughput concerns. It is understood that different embodiments disclosed herein offer different disclosure, and that they may make various changes, substitutions and alterations herein without departing from the spirit and scope of the present disclosure.

Thus, it will be appreciated that described in one of the broader embodiments herein a method is provided. The method includes measuring a first topographical height of a substrate at a first coordinate on the substrate and measuring a second topographical height of the substrate at a second coordinate on the substrate. The measured first and second topographical heights are stored (e.g., FIG. 8) as a wafer map. An exposure process is then performed on the substrate using the wafer map. The exposure process includes using a first focal point when exposing the first coordinate on the substrate and using a second focal plane when exposing the second coordinate on the substrate. The first focal point is determined using the first topographical height and the second focal point is determined using the second topographical height.

In a further embodiment, measuring the first and second topographical heights is performed concurrently using a multi-tip atomic force microscopy (AFM) tool. The second topographical height measurement may be performed substantially concurrently with the exposing of the first coordinate.

In an embodiment, the wafer map is generated by determining an offset value between the first topographical height and a third height associated with the first coordinate. In one embodiment, determining the third height includes performing an optically based height measurement using an exposure tool. In another embodiment, determining the third height includes using at least one of design data and process data. The exposure tool may be an extreme ultraviolent (EUV) scanner used for the exposing of the first and second coordinates.

The method may include providing an air-gauge based metrology tool to perform the measuring the first and second topographical heights on the substrate. The exposure tool (that performs the exposing the first and second coordinate on the substrate) may be separate from the air-gauge metrology tool. The first and second topographical heights may then be sent from the air-gauge based metrology tool to the exposure tool prior to the exposing. In yet a further embodiment, the substrate is disposed in the exposure tool under a vacuum environment. In an embodiment, each of the measuring the first and second topographical heights and the performing the exposure process are performed in-situ in a vacuum environment.

In another of the embodiments discussed herein a system is described. The system includes a substrate stage, operable to hold a wafer, a scanner module and a multi-tip AFM tool. See FIG. 3. The scanner module can expose a pattern on the wafer while the wafer is disposed in the substrate stage. Likewise, the multi-tip AFM tool (each tip of the multi-tip AFM tool) is operable measure a height of the wafer while the wafer is disposed in the substrate stage.

In a further embodiment, the substrate stage is disposed in a vacuum environment. One type of scanner module is that including an extreme ultraviolet (UV) radiation source. In an embodiment, the system further includes a parameter control module coupled to the multi-tip AFM tool and the scanner module. The parameter control module can include a processor; and a non-transitory, computer-readable storage communicatively coupled to the processor and including instructions executable by the processor. The instructions includes those that: receive a first measurement from the multi-tip AFM tool; determine a first lithography process parameter using the first measurement; and the first lithography process parameter to the scanner module. In one embodiment, the first lithography process parameter is a depth of focus (DOF).

In yet another of the broader forms of systems described herein, provided is a system for semiconductor device fabrication including a metrology tool, a process parameter control module, and a lithography tool. The metrology tool is operable to determine a plurality of topographical heights, for example, using an AFM tool or a sensor operable to sense air discharged onto a target surface. The process parameter control module is operable to generate a wafer map using the plurality of topographical heights. The lithography tool is operable to receive the wafer map and perform an exposure process according to the wafer map.

In an embodiment, the lithography tool performs the exposure process according to the wafer map by determining a depth of focus using the wafer map. The metrology tool may be embedded in the lithography tool. (FIG. 3). In an embodiment, the wafer map includes an offset value between each of the plurality of topographical heights and an optically-measured height determined by the lithography tool (e.g., by the EUV scanner).

What is claimed is:

1. A method, comprising:
providing an air-gauge metrology tool;
measuring a first topographical height at a first coordinate on a first substrate using the air-gauge metrology tool;
measuring a second topographical height at a second coordinate on the first substrate using the air-gauge metrology tool;
generating a wafer map, wherein the generating the wafer map includes determining a comparison of the first topographical height at the first coordinate and a predicted topographical height at the first coordinate, wherein the predicted topographical height is gathered from at least one of design data or process data for other substrates;
performing a first exposure process on the first substrate using the wafer map and the measured first and second topographical heights, wherein the first exposure process includes:
using a first focal point when exposing the first coordinate on the first substrate, wherein the first focal point is determined using the first topographical height; and
using a second focal point when exposing the second coordinate on the first substrate, wherein the second focal point is determined using the second topographical height; and
performing a second exposure process on a second substrate using the measured first and second topographical heights, without performing a topographical height measurement on the second substrate.

2. The method of claim 1, wherein the generating the wafer map is generated using predicted topographical height based on data gathered from analysis of the other substrates.

3. The method of claim 1, wherein the measuring the second topographical height is performed substantially concurrently with the exposing of the first coordinate.

4. The method of claim 1, wherein the first exposure process is performed using an exposure tool of an extreme ultraviolet (EUV) scanner used for the exposing of the first and second coordinates.

5. The method of claim 1, further comprising:
providing an exposure tool separate from the air-gauge metrology tool, wherein the exposure tool performs the exposing of the first and second coordinates on the first substrate; and
sending the first and second topographical heights from the air-gauge metrology tool to the exposure tool prior to the exposing.

6. The method of claim 5, further comprising:
disposing the first substrate in the exposure tool under a vacuum environment.

7. The method of claim 1, wherein the measuring the first and second topographical heights and the performing the first exposure process are performed in-situ in a vacuum environment.

8. The method of claim 1, further comprising: delivering the measured first and second topographical heights directly to an exposure tool without generating a wafer map.

9. The method of claim 1, wherein the measuring the first topographical height on the first substrate includes measuring an upper surface of a photoresist layer.

10. The method of claim 1, wherein the generating the wafer map includes representing the comparison as a grayscale value.

11. A method for semiconductor device fabrication, comprising:
providing a metrology tool embedded in a lithography tool;
using the metrology tool to determine a plurality of topographical heights, wherein the using the metrology tool is a detector of air discharged onto a first target surface of a first substrate;

using a process parameter control module operable to generate a wafer map from the plurality of topographical heights, wherein the generating the wafer map includes:
  determining a comparison of each of the plurality of topographical heights with a predicted topographical height based on design data;
  sending the wafer map to the lithography tool operable to receive the wafer map;
  performing a first exposure process on the first target surface using the lithography tool according to the wafer map, wherein the performing the first exposure process includes exposing a first coordinate on the first target surface while concurrently using the metrology tool to determine a first topographical height of the plurality of topographical heights, the first topographical height of a second coordinate on the first target surface; and
  performing a second exposure process on a second target surface of a second substrate using the lithography tool according to the wafer map, without performing a topographical height measurement on the second substrate.

12. The method of claim 11, wherein the lithography tool performs the first exposure process according to the wafer map by determining a depth of focus using the wafer map.

13. The method of claim 11, wherein the wafer map includes gray-scale representation of an offset value between each of the plurality of topographical heights and the predicted topographical height.

14. The method of claim 11, further comprising: wherein the wafer map is an offset wafer map.

15. The method of claim 11, wherein the determining the comparison of each of the plurality of topographical heights with the predicted topographical height is based on the design data and simulation data.

16. The method of claim 11, wherein the performing the first exposure process and determining the plurality of topographical heights are performed without displacement of the first target surface.

17. A method of semiconductor device fabrication, comprising:
  determining a plurality of topographical heights by discharging air onto a first target surface of photoresist on a first substrate;
  gathering data including process data from second and third substrates;
  generating a wafer map including a plurality of offset values between the plurality of topographical heights and the process data;
  sending the wafer map to a lithography tool;
  performing a first exposure process on the first target surface of photoresist using the lithography tool according to the wafer map, wherein the performing the first exposure process includes exposing a first coordinate on the first target surface of photoresist;
  concurrently with performing the first exposure process, determining a first topographical height of the plurality of topographical heights, the first topographical height of a second coordinate on the first target surface of photoresist; and
  performing a second exposure process on a second target surface of a second substrate using the lithography tool according to the wafer map, without performing a topographical height measurement on the second substrate.

18. The method of claim 17, wherein the first substrate is not moved from a scanner of the lithography tool during the performing the first exposure process and the determining the first topographical height.

* * * * *